United States Patent
Gunturi et al.

(10) Patent No.: US 6,596,584 B1
(45) Date of Patent: Jul. 22, 2003

(54) METHOD FOR FABRICATING A SELF-ALIGNED SOURCE LINE FLASH MEMORY DEVICE

(75) Inventors: Sarma S. Gunturi, Plano, TX (US); Paul A. Chintapalli, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 182 days.

(21) Appl. No.: 09/692,691

(22) Filed: Oct. 19, 2000

Related U.S. Application Data (60) Provisional application No. 60/171,211, filed on Dec. 15, 1999.

(51) Int. Cl.⁷ .......................................... H01L 21/8234
(52) U.S. Cl. ...................... 438/257; 438/261; 438/262; 438/279; 438/287; 438/294; 438/295; 438/296; 438/297; 438/299; 438/301
(58) Field of Search ................. 438/257, 261, 438/262, 279, 287, 294, 295, 296, 297, 299, 301

(56) References Cited

U.S. PATENT DOCUMENTS

| | | | | |
|---|---|---|---|---|
| 5,210,047 A | * | 5/1993 | Woo et al. | 148/DIG. 19 |
| 6,071,779 A | * | 6/2000 | Mehrad et al. | 438/262 |
| 6,087,220 A | * | 7/2000 | Rogers et al. | 438/257 |
| 6,180,460 B1 | * | 1/2001 | Cremonesi et al. | 438/264 |

* cited by examiner

*Primary Examiner*—Richard Elms
*Assistant Examiner*—Pho M. Luu
(74) *Attorney, Agent, or Firm*—Peter K. McLarty; W. James Brady, III; Frederick J. Telecky, Jr.

(57) ABSTRACT

A method for fabricating a flash memory device having a self-aligned source includes providing a semiconductor substrate having a source region separated from a drain region by a channel region. The method also includes forming an isolation structure in the semiconductor substrate that crosses the source, drain, and channel regions of the semiconductor substrate. The method also includes forming a continuous stack structure outwardly from the channel region of the semiconductor substrate and the isolation structure. The method includes depositing a bottom anti-reflective layer over the semiconductor substrate, the isolation structure and the stack structure to substantially uniformly planarize the semiconductor substrate and the isolation structure. The method further includes depositing a photoresist layer over select portions of the bottom anti-reflective layer and the continuous stack structure to form a self-aligned source pattern using a photo mask. The method includes etching the isolation structure and the bottom anti-reflective layer corresponding to the self aligned source pattern using a low selectivity etch process to remove a portion of the isolation structure and etching a remaining portion of the isolation structure using high selectivity etch process.

7 Claims, 5 Drawing Sheets

METHOD FOR FABRICATING A SELF-ALIGNED SOURCE LINE FLASH MEMORY DEVICE

This application claims priority under 35 USC §119(e)(1) of provisional application No. 60/171,211 filed Dec. 15, 1999.

TECHNICAL FIELD OF THE INVENTION

This invention relates generally to the field of electronic devices and more particularly to a method for fabricating a self-aligned source line flash memory device.

BACKGROUND OF THE INVENTION

Most modern electronic equipment, such as phones and computers, are generally constructed using semiconductor components, such as integrated circuits, memory chips, and the like. The semiconductor components are generally constructed from various microelectronic devices fabricated on a semiconductor substrate, such as transistors, capacitors, diodes, resistors, and the like. Each microelectronic device is typically a pattern of conductive, semiconductive, and insulative regions formed on the semiconductor substrate.

FLASH memory, also known as FLASH EPROM or FLASH EEPROM, is a semiconductor component that is formed from an array of memory cells. Data can be written to each cell within the array, but the data is erased in blocks of cells. Each cell includes a floating gate transistor having a source, a drain, a floating gate, and a control gate. The floating gate transistor uses channel hot electrons for writing from the drain and uses Fowler-Nordheim tunneling for erasure from the source. The source of each floating gate transistor in the cells of a row in the array are connected to form a source line.

The cells are electrically isolated from one another by an isolation structure. One type of isolation structure used is a LOCal Oxidation of Silicon (LOCOS) structure. LOCOS structures are generally formed by thermally growing a localized oxidation layer between the cells to electrically isolate the cells. Another type of isolation structure used is a Shallow Trench Isolation (STI). STI structures are generally formed by etching a trench between the cells and filling the trench with a suitable dielectric material.

Some source line fabrication processes utilize a patterned photomask that exposes a source region of the semiconductor substrate as well as a portion of the floating gate transistors in the array. The exposed areas are subsequently anisotropically etched and then subjected to an ion implantation process that forms the source line and the self-aligned source for each floating gate transistor. Although the etching process is non-selective to the materials comprising the semiconductor substrate and the floating gate transistor and the field oxide, the etching process removes a portion of the exposed semiconductor substrate and the floating gate transistor along with the desired removal of the field oxide region to form the continuous source line.

The removed portion of the semiconductor substrate generally forms a trench in the source line region between the floating gates. The trench adversely affects the performance of the floating gate transistor due to the depth difference between the floating gate and the source line. This depth difference can result in a source-to-drain short of the floating gate transistor. The depth difference also lowers the dopant concentration in the source adjacent the floating gate transistor. The low dopant concentration can result in erase errors during operation of the memory array.

SUMMARY OF THE INVENTION

Accordingly, a need has arisen for an improved source line fabrication process for flash memory. The present invention provides a method for fabricating a self-aligned source line for a flash memory device that substantially eliminates or reduces problems associated with the prior methods.

In accordance with the one embodiment of the present invention, a method for fabricating a flash memory device having a self-aligned source includes providing a semiconductor substrate having a source region separated from a drain region by a channel region. The method also includes forming an isolation structure in the semiconductor substrate that crosses the source, drain, and channel regions of the semiconductor substrate. The method also includes forming a continuous stack structure outwardly from the channel region of the semiconductor substrate and the isolation structure. The method includes depositing a bottom anti-reflective layer over the semiconductor substrate, the isolation structure and the stack structure to substantially uniformly planarize the semiconductor substrate and the isolation structure. The method further includes depositing a photoresist layer over select portions of the bottom anti-reflective layer and the continuous stack structure to form a self-aligned source pattern using a photo mask. The method includes etching the isolation structure and the bottom anti-reflective layer corresponding to the self aligned source pattern using a low selectivity etch process to remove a portion of the isolation structure and etching a remaining portion of the isolation structure using high selectivity etch process.

Important technical advantages of the present invention include fabricating a source line that has minimum or no trenching in the source line region compared to the bottom of the floating gate. This reduces the stress on the floating gate transistor and can reduce the likelihood of a source-to-drain short in the transistor. Accordingly, the present invention substantially reduces the likelihood of transistors within the memory array that are non-functional. Another technical advantage of the present invention includes greater uniformity and concentration of dopant within the source region adjacent the floating gate transistor.

Other technical advantages will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 7 illustrate various aspects of an electronic device and the fabrication of a source line used within the electronic device. As described in greater detail below, the present invention and details of the processes for fabricating a source line is disclosed. The process includes the use of anti-reflective coating in addition to the photoresist at the self-aligned source pattern step in the manufacturing process to reduce or eliminate similar problems in the fabrication of a source line in a memory array. In addition to the antireflective coating, a plasma etch process using specific selectivities are used in different steps of process.

Figure 1:
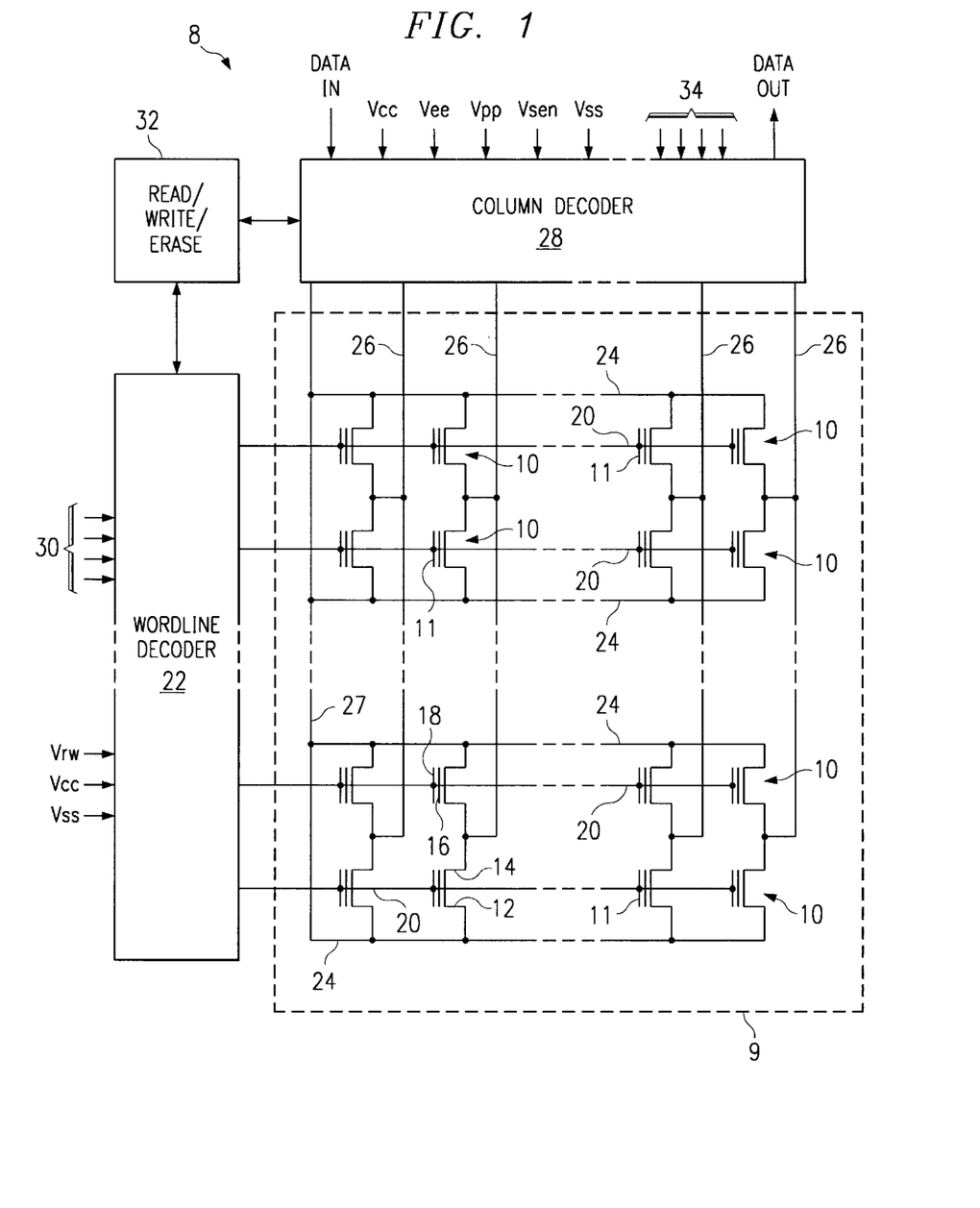
FIG. 1 is an electrical schematic diagram, in partial block diagram form, of an electronic device which includes a memory array in accordance with the present invention.

FIG. 1 is an electrical schematic diagram, in partial block form, of an electronic device 8 in accordance with one embodiment of the present invention. The electronic device 8 includes a wordline decoder 22, a column decoder 28, a Read/Write/Erase control circuit 32 for controlling the decoders 22 and 28, and a memory array 9. The memory array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28, and each of the drain-column lines 26 is coupled to the column decoder 28.

In a write or program mode, the wordline decoder 22 may function, in response to wordline address signals on lines 30 and to signals from the Read/Write/Erase control circuit 32, to place a preselected first programming voltage $V_{RW}$, approximately +12V, on a selected wordline 20, which is coupled to the control gate 18 of a selected cell 10. Column decoder 28 also functions to place a second programming voltage $V_{PP}$, approximately +5 to +10V, on a selected drain-column line 26 and, therefore, the drain 14 of the selected cell 10. Source lines 24 are coupled to a reference potential $V_{SS}$ through line 27. All of the deselected drain-column lines 26 are coupled to the reference potential $V_{SS}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2V to −6V with respect to the gate region. For memory cells 10 fabricated in accordance with one embodiment of the present invention, the coupling coefficient between the control gate 18, the wordline 20, and the floating gate 16 is approximately 0.5. Therefore, a programming voltage $V_{RW}$ of 12 volts, for example, on a selected wordline 20, which includes the selected gate control 18, places a voltage of approximately +5 to +6V on the selected floating gate 16. The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{SS}$. The column decoder 28 also functions to apply a high positive voltage $V_{EE}$, approximately +10V to +15V, to all of the source lines 24. These erasing voltages create sufficient field strength across the tunneling area between floating gate 16 and the semiconductor substrate to generate a Fowler-Nordheim tunnel current that transfers charge from the floating gate 16, erasing the memory cell 10.

In the read mode, the wordline decoder 22 functions, in response to wordline address signals on lines 30 and to signals from Read/Write/Erase control circuit 32, to apply a preselected positive voltage $V_{CC}$, approximately +5V, to the selected wordline 20, and to apply a low voltage, ground or $V_{SS}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
| --- | --- | --- | --- |
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

Figure 2:
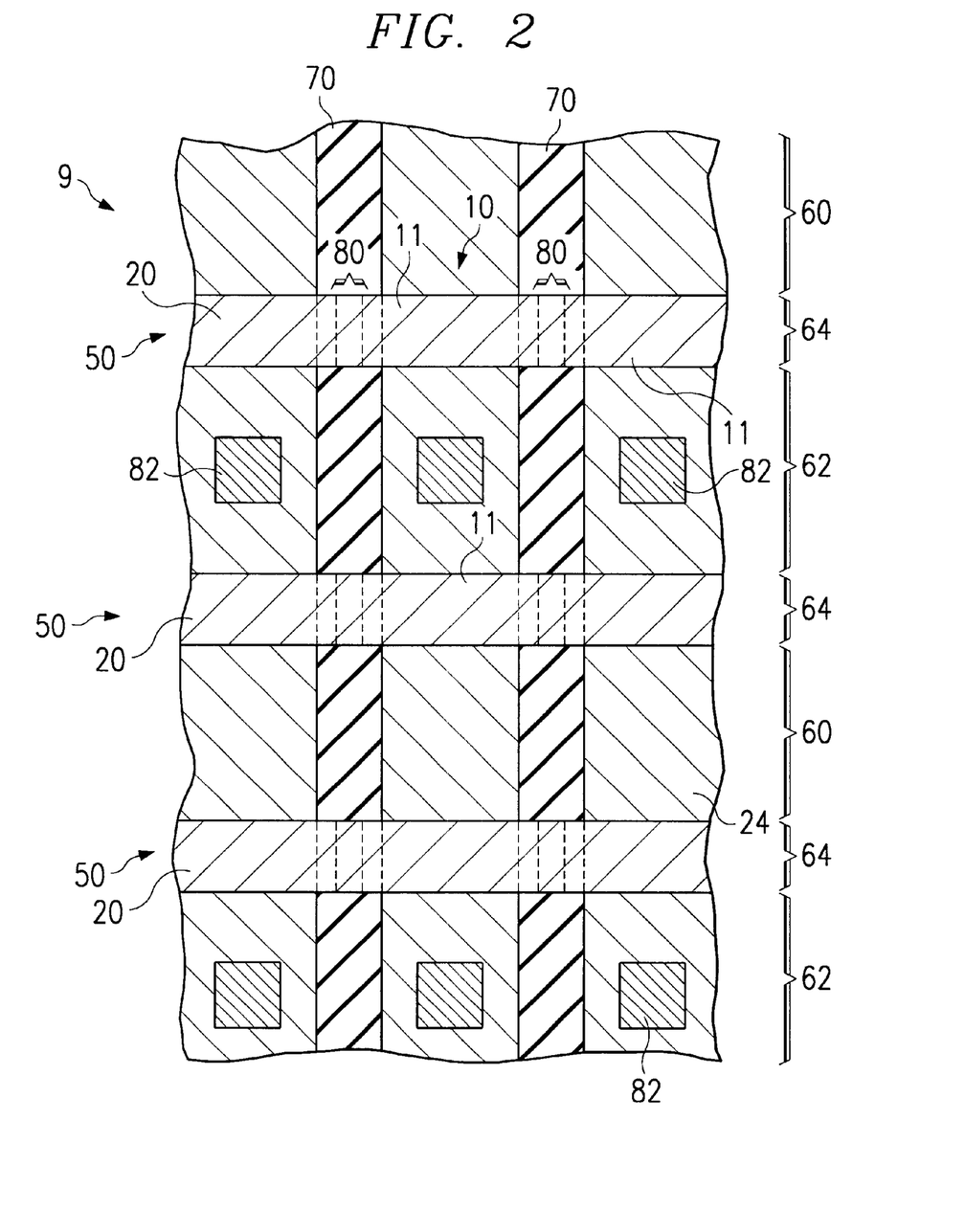
FIG. 2 is an enlarged plan view of a portion of the memory array of FIG. 1 in accordance with the present invention.
Figure 3:
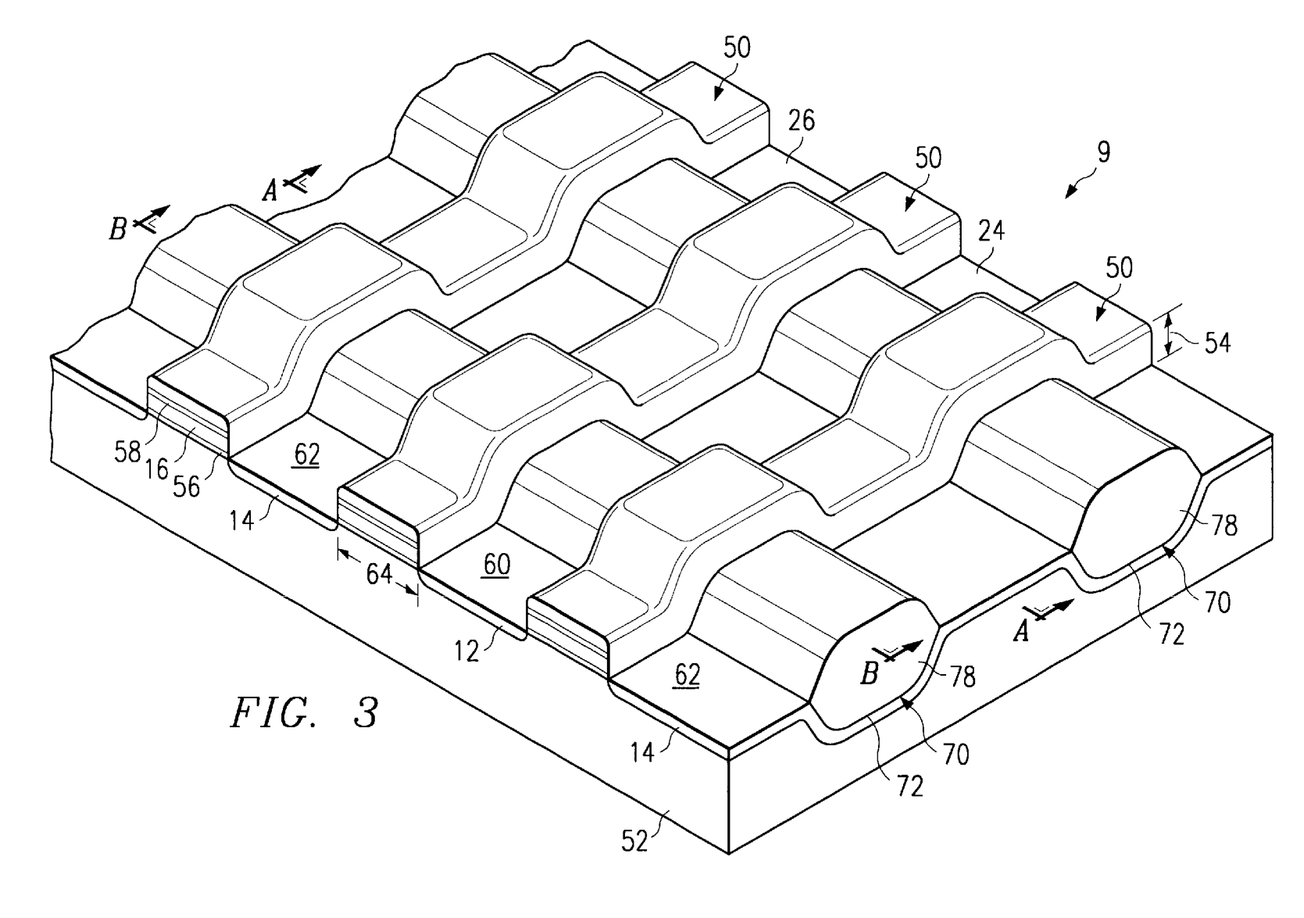
FIG. 3 is a perspective view of a portion of the memory array of FIG. 2 in accordance with the present invention.

FIGS. 2 and 3 illustrate the structure of a portion of the memory array 9 illustrated in FIG. 1. Specifically, FIG. 2 is an enlarged plan view of a portion of a memory array 9, and FIG. 3 is a perspective view of a portion of the memory array 9 illustrated in FIG. 2. As discussed above, the memory array 9 includes a number of memory cells 10 arranged in rows and columns.

As best illustrated in FIG. 3, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by an isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. However, it will be understood that the semiconductor substrate 52 may comprise other suitable materials or layers without departing from the scope of the present invention. For example, the semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 3, the floating gate transistors 11 in each continuous stack structure 50 in the memory array 9 are electrically isolated from one another by the isolation structure 70. The isolation structures 70 are generally formed prior to the fabrication of the gate stack 54 on the semiconductor substrate 52. The isolation structures 70 are LOCal Oxidation of Silicon (LOCOS) structures or shallow trench isolation (STI) structures. A LOCOS structure is illustrated in FIG. 3. As described in greater detail below, the isolation structure 70 includes the isolation dielectric material 78.

LOCOS structures are generally formed by thermally growing a localized oxidation layer between the cells 10 to electrically isolate the cells 10. The LOCOS structure is generally grown to a thickness on the order of 600 to 1,000 nanometers, using a steam growth process or a High Pressures Oxidation (HIPOX) process. The LOCOS structure forms a trench 72 having a dish shape as illustrated in FIG. 3. The growth process to form a LOCOS structure generally forms silicon dioxide within the silicon substrate 52. One problem associated with LOCOS structures is that they include non-functional areas, such as a birds beak, that waste valuable space on the semiconductor substrate 52.

The isolation dielectric material 78 forming the isolation structure 70, a LOCOS structure, may be etched back, followed by a deglaze process to clean the surface of the semiconductor substrate 52 prior to fabrication of the gate stack 54. It will be understood that the isolation dielectric material 78 may comprise other suitable dielectric materials without departing from the scope of the present invention.

The continuous stack structure 50 is then fabricated outwardly from the semiconductor substrate 52 and the isolation oxide 78. The continuous stack structure 50 is formed from a series of gate stacks 54 fabricated outwardly from the channel region 64 of the semiconductor substrate 52. As best shown in FIG. 3, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 100 to 500 angstroms in thickness. It will be understood that the gate insulator 56 may comprise other materials suitable for insulating semiconductor elements.

The floating gate 16 and the control gate 18 are conductive regions. The gates 16 and 18 generally comprise a polycrystalline silicon material (polysilicon) that is in-situ doped with impurities to render the polysilicon conductive. The thickness of the gates 16 and 18 are generally on the order of 100 nanometers and 300 nanometers, respectively. It will be understood that the gates 16 and 18 may comprise other suitable conductive materials without departing from the scope of the present invention.

The interstitial dielectric 58 may comprise oxide, nitride, or a heterostructure formed by alternating layers of oxide and nitride. The interstitial dielectric 58 is on the order of 20 to 40 nanometers in thickness. It will be understood that the interstitial dielectric 58 may comprise other materials suitable for insulating semiconductor elements.

As best illustrated in FIG. 2, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. In one embodiment, the floating gates 16 in adjacent memory cells 10 are isolated by a gap 80. The gap 80 is generally etched into a layer of conductive material (not shown) that is used to form the floating gate 16.

The source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26. The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 3, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 3, the source line 24 is formed as a continuous source line with minimum trenching in the source region 12 using a bottom anti-reflective coating followed by the pattern masking of source line 24, followed by a two step oxide etch. In contrast, the isolation structures 70 electrically isolate the adjacent floating gate transistors 11 in the channel region 64 of the semiconductor substrate. A method of pattern masking used in the formation of the source line 24 is described in greater detail below.

Figure 4A:
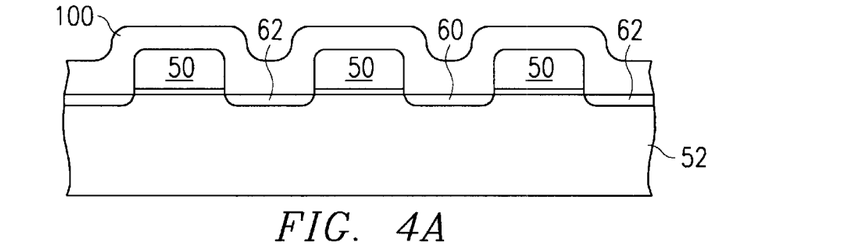
FIGS. 4A and 4B are diagrams illustrating section views of the memory array illustrated in FIG. 3 taken along the lines A—A and B—B, respectively, of FIG. 3 after application of a bottom ant-reflective coating layer in accordance with an embodiment of the present invention.
Figure 4B:
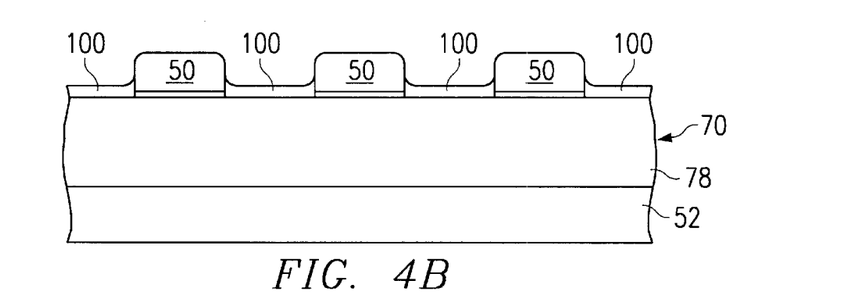

FIGS. 4A and 4B are diagrams illustrating section views of the memory array 9 illustrated in FIG. 3 taken along the lines A—A and B—B, respectively, of FIG. 3. In accordance with one embodiment of the present invention, a bottom anti-reflective coating (BARC) layer 100 is deposited over the memory array 9. For example, as illustrated in FIGS. 4A and 4B, BARC layer 100 is applied over memory array 9 such that BARC layer 100 covers a portion of stack structures 50 at various locations along the length of stack structures 50, as well as covering source and drain regions 60 and 62, respectively. The thickness of the BARC layer 100 may be in the range of 800 to 1500 angstroms. However, the thickness of the BARC layer 100 can depend on the thickness of isolation structure 70 without departing from the scope of the present invention. BARC layer 100 generally comprises an oxide bottom anti-reflective material such that an etch rate of BARC layer 100 is substantially equivalent to an etch rate of isolation dielectric material 78.

As illustrated in FIGS. 4A and 4B, BARC layer 100 is applied to memory array 9 such that BARC layer 100 fills source regions 60 to a depth substantially equal to or exceeding a thickness of adjacent isolation structure 70. Thus, as best illustrated in FIG. 4B, filling source regions 60 with BARC layer 100 to a depth exceeding the thickness of adjacent isolation structure 70 causes a portion of BARC layer 100 to extend over and be disposed on adjacent isolation structure 70. For example, the material comprising BARC layer 100 may be applied to memory array 9 and baked at approximately 190 degrees Celsius to provide flow of BARC layer 100 into regions adjacent isolation structures 70. Thus, in operation, BARC layer 100 forms a sacrificial barrier over source regions 60 to protect source regions 60 during subsequent self-aligned source pattern formation.

Figure 5A:
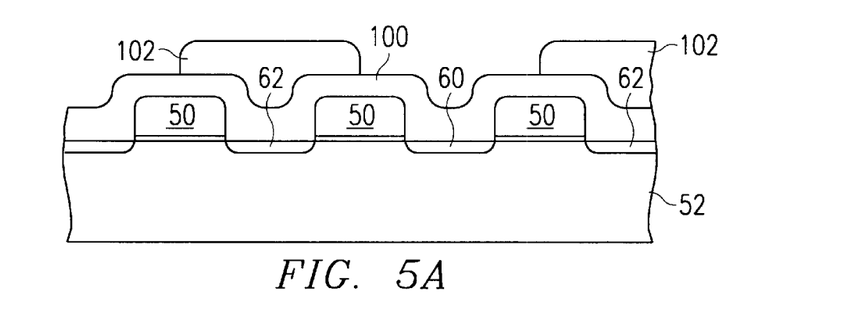
FIGS. 5A and 5B are diagrams illustrating section views of the memory array illustrated in FIG. 3 taken along the lines A—A and B—B, respectively, of FIG. 3 after application of a photoresist layer in accordance with an embodiment of the present invention.
Figure 5B:
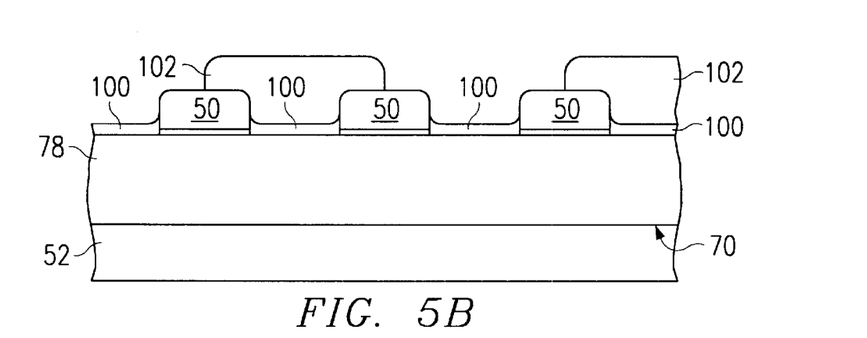

FIGS. 5A and 5B are diagrams illustrating section views of the memory array 9 taken along the lines A—A and B—B, respectively, of FIG. 3 after a photoresist layer 102 has been applied to memory array 9. Once BARC layer 100 has been applied to memory array 9, photoresist layer 102 is applied over select portions of stack structures 50 in preparation to form the self-aligned source pattern. For example, photoresist layer 102 may be deposited over select portions of stack structures 50 and extending across drain region 62.

Figure 6A:
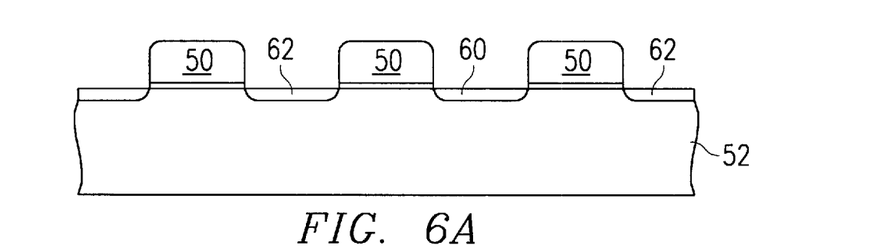
FIGS. 6A and 6B are diagrams illustrating section views of the memory array illustrated in FIG. 3 taken along the lines A—A and B—B, respectively, of FIG. 3 after an etching process in accordance with an embodiment of the present invention.
Figure 6B:
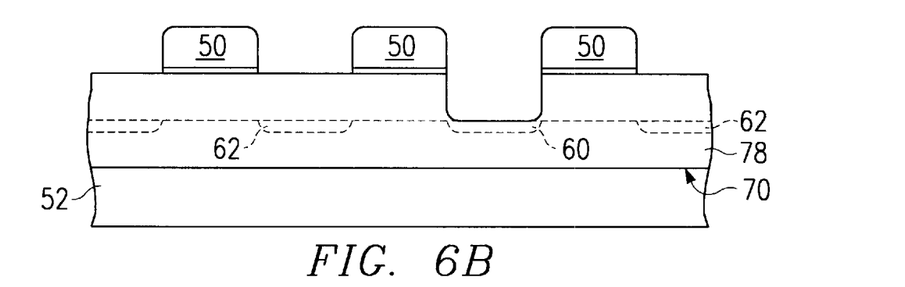

FIGS. 6A and 6B are diagrams illustrating section views of memory array 9 taken along the line A—A and B—B, respectively, of FIG. 3 after etching a portion of the memory array 9 to form the self-aligned source pattern. Once photoresist layer 102 has been applied to memory array 9, the self-aligned source pattern step is performed using conventional photolithography techniques. For example, the exposed portions of the isolation structure 70 and the BARC layer 100 over the semiconductor substrate 52 are then etched to remove the isolation dielectric material 78 using a low selectivity etch process. The selectivity is defined as the etch rate ratios of the isolation dielectric material 78 to the BARC coating 100 until approximately half the thickness of the isolation dielectric material 78 is cleared, thereby leaving a portion of the BARC coating 100 on the semiconductor substrate 52. For example, a generally low etch selectivity ratio, such as a 7:1 to 10:1 selectivity ratio, may be used to remove photoresist layer 102, BARC layer 100, and approximately half of the isolation dielectric material 78. However, other suitable selectivity etch ratios may be used to remove photoresist layer 102, BARC layer 100, and approximately half of the isolation dielectric material 78.

Thus, in operation, a generally low selectivity etch is used to form the self-aligned source pattern such that BARC layer 100 and approximately half of the isolation dielectric material 78 are moved at a substantially equivalent rate. Thus, BARC layer 100 is removed corresponding to source regions 60 at a substantially equivalent rate as approximately half of the isolation dielectric material 78. Therefore, BARC layer 100 provides a sacrificial layer of material to protect source regions 60 while etching an upper portion, or approximately half, of isolation structure 70.

Once the etch reaches a level of memory array 9 corresponding to source regions 60, the etch may be terminated to substantially prevent etching source regions 60. As best illustrated in FIG. 6B, once the etch has been terminated, a lower portion, or approximately half, of the isolation dielectric material 78 remains.

Figure 7A:
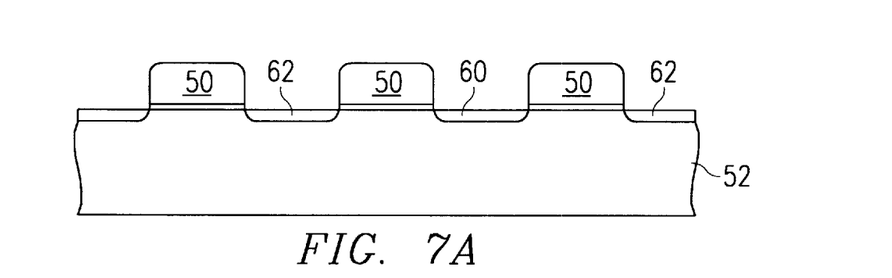
FIGS. 7A and 7B are diagrams illustrating section views of the memory array illustrated in FIG. 3 taken along the lines A—A and B—B, respectively, of FIG. 3 after and additional etching process in accordance with an embodiment of the present invention.
Figure 7B:
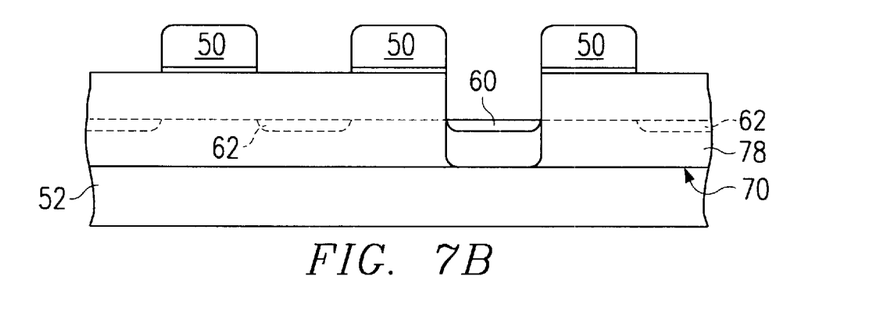

FIGS. 7A and 7B are diagrams illustrating section views of memory array 9 taken along the line A—A and B—B, respectively, of FIG. 3 after etching the remaining portion of isolation structure 70. For example, a high selectivity etch process is used to clear the remaining portion of isolation dielectric material 78 with minimum or no trenching of the source regions 60. The etching process to remove the remaining isolation dielectric material 78 may be an anisotropic etching process. Anisotropic etching may be performed using a reactive ion etch (RIE) process using carbon-fluorine based gases such as $CF_4$ or $CHF_3$. The etching process is selective to the isolation dielectric material 78 and is non-selective to the material comprising the semiconductor substrate 52. Thus, the etching process substantially removes the isolation dielectric material 78 without substantially removing the material comprising the semiconductor substrate 52.

The high stresses associated with conventional trenching formed immediately adjacent to a gate stack have been determined to be a factor in the failure of a floating gate transistor. The stresses on the gate stack associated with the minimum or no trenching are lower than those associated with conventional notches. Therefore, the failure rate of floating gate transistors in operation with the minimum or no trenching is lower than the failure rate of floating gate transistors in operation with conventional silicon trenching. In addition, the reduced trenching increases the uniformity of the source region 12, thereby increasing the operating performance of the floating gate transistor 11.

The exposed portion of the semiconductor substrate 52, including that portion of the semiconductor substrate 52 forming the trench 72, is doped with impurities to form a conductive region. The conductive region is doped by an implantation process in which dopant ions are impinged into the semiconductor substrate 52. The photomask inhibits the dopant ions from impinging the masked portions of the continuous stack structure 50.

The conductive region is then thermally treated to diffuse the dopant ions into the semiconductor substrate 52 to form both the source 12 of each floating gate transistor 11 as well as the source line 24. This conductive region forms the self-aligned source 12 for each floating gate transistor 11. Although the present invention has been described with several embodiments, various changes and modifications may be suggested to one skilled in the art. It is intended that the present invention encompass such changes and modifications that follow within the scope of the appended claims.

What is claimed is:

1. A method for fabricating a flash memory device having a self-aligned source, comprising:

provulating a semiconductor substrate having a source region separated from a drain region by a channel region;

forming an isolation structure in the semiconductor substrate that crosses the source, drain, and channel regions of the semiconductor substrate;

forming a continuous stack structure outwardly from the channel region of the semiconductor substrate and the isolation structure;

depositing a bottom anti-reflective layer over the semiconductor substrate, the isolation structure and the stack structure to substantially uniformly planarize the semiconductor substrate and the isolation structure;

depositing a photoresist layer over select portions of the bottom anti-reflective layer and the continuous stack structure to form a source pattern using a photo mask;

etching the isolation structure and the bottom anti-reflective layer corresponding to the source pattern using a low selectivity etch process to remove a portion of the isolation structure; and etching a remaining portion of the isolation structure using a high selectivity etch process.

2. The method of claim 1, wherein depositing the bottom anti-reflective layer comprises depositing the bottom anti-reflective layer in the source regions to a thickness greater than a thickness of the isolation structure.

3. The method of claim 1, wherein depositing the bottom anti-reflective layer comprises:

applying an oxide bottom anti-reflective material to the isolation structure and the source regions; and heating the oxide bottom ant-reflective material to cause the oxide bottom ant-reflective material to flow into the source regions to a thickness greater than a thickness of the isolation structure.

4. The method of claim 3, wherein heating comprises heating the oxide bottom ant-reflective material to approximately 190 degrees Celsius.

5. The method of claim 1, wherein depositing the bottom anti-reflective layer comprises depositing the bottom anti-reflective layer in the source regions to a thickness substantially equal to a thickness of the isolation structure.

6. The method of claim 1, wherein etching the isolation structure and the bottom anti-reflective layer comprises removing a portion of the isolation structure and the bottom anti-reflective layer at a substantially equal rate.

7. The method of claim 1, further comprising terminating the etch of the isolation structure and the bottom anti-reflective layer in response to reaching a semiconductor substrate layer disposed beneath the bottom anti-reflective layer.

* * * * *